United States Patent [19]

Marantette

[11] Patent Number: 5,267,818
[45] Date of Patent: Dec. 7, 1993

[54] ARRANGEMENT FOR PROVIDING PLANAR MOVEMENT OF A MACHINE TOOL

[75] Inventor: William F. Marantette, Torrance, Calif.

[73] Assignee: Optima Industries, Inc., Torrance, Calif.

[21] Appl. No.: 740,151

[22] Filed: Aug. 5, 1991

[51] Int. Cl.$^5$ .......................... B23B 39/16; B23C 1/08
[52] U.S. Cl. ....................... 409/132; 144/134 C;
144/144 A; 408/1 R; 408/3; 403/112; 403/214;
403/217; 403/235
[58] Field of Search ................... 909/91, 96, 107, 192,
909/235, 214, 217, 131, 132; 29/39; 408/1 R, 3;
144/134 C, 144 A, 368

[56]  References Cited
U.S. PATENT DOCUMENTS

| 3,618,465 | 11/1971 | Brochard | 409/91 X |
| 4,029,427 | 6/1977 | Cloup | 408/3 |
| 4,523,882 | 6/1985 | Hengesbach | 408/236 |
| 4,776,749 | 10/1988 | Wanzenberg et al. | 29/39 X |
| 4,787,138 | 11/1988 | Eaton et al. | 29/748 |

FOREIGN PATENT DOCUMENTS 2357355  2/1978  France ..................... 409/91

Primary Examiner—Z. R. Bilinsky
Attorney, Agent, or Firm—Poms, Smith, Lande & Rose

[57]  ABSTRACT

An arrangement for providing universal movement of a machine tool is provided in which there are parallelogram linkages, one of which has a link which maintains parallelism with a worktable and is movable in any direction in a plane. A machine tool is carried by this link to perform an operation on a workpiece on the worktable. Two linear actuators converge from pivotal mountings on the worktable to the link. Selective extension and retraction of the actuators causes appropriate planar movement of the machine tool. A limit switch arrangement is provided by marking the movement of a portion of the mechanism on a plate as the mechanism is extended to its limits, cutting out the plate along the line marked, and positioning the actuating arm of a limit switch in the opening. Movement to the limits of the mechanism's travel will trip the switch and interrupt power to the actuators.

38 Claims, 9 Drawing Sheets

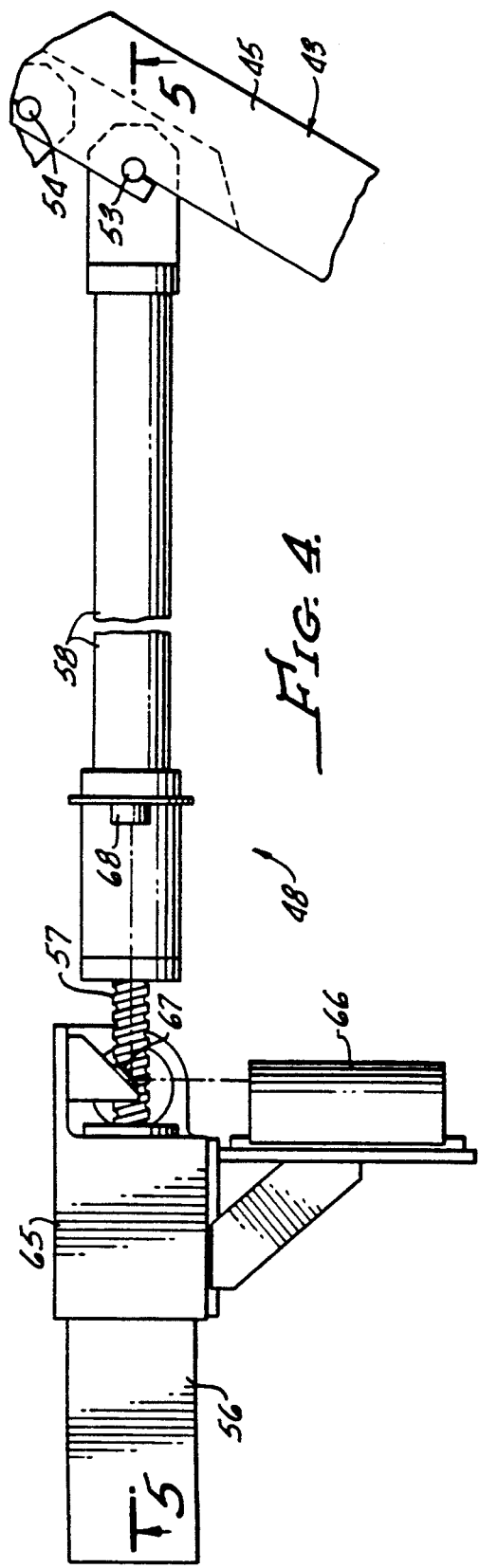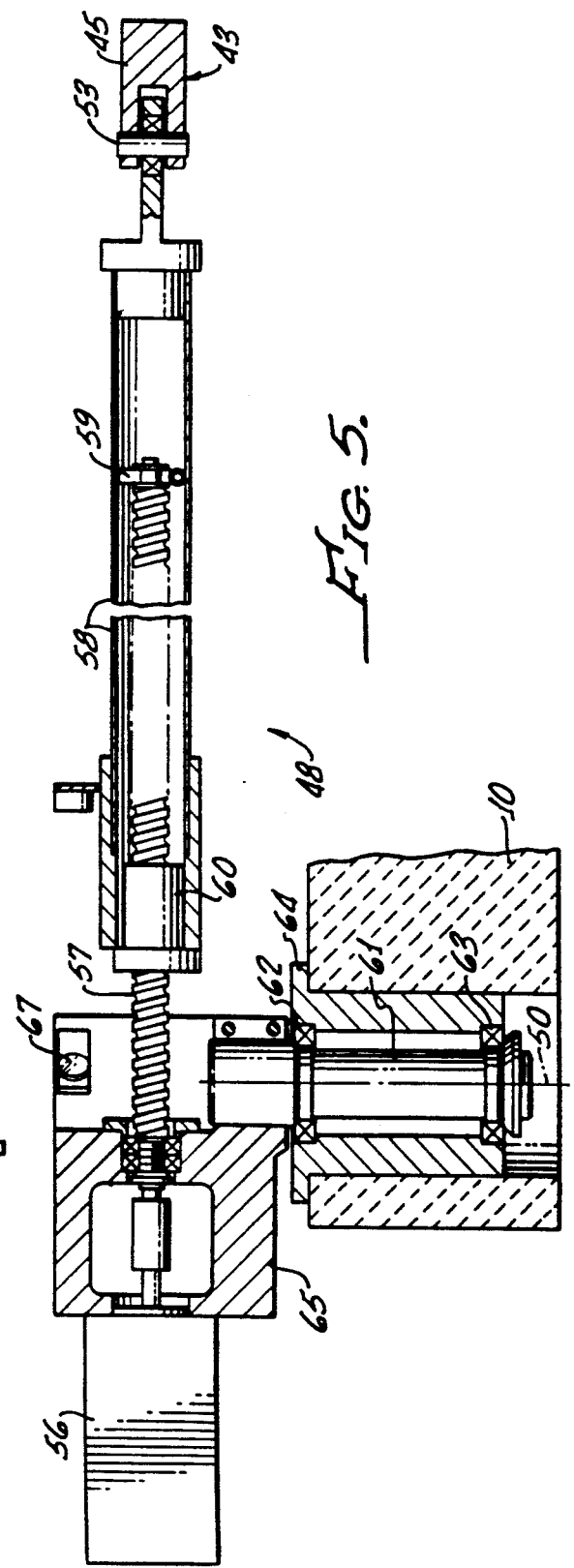

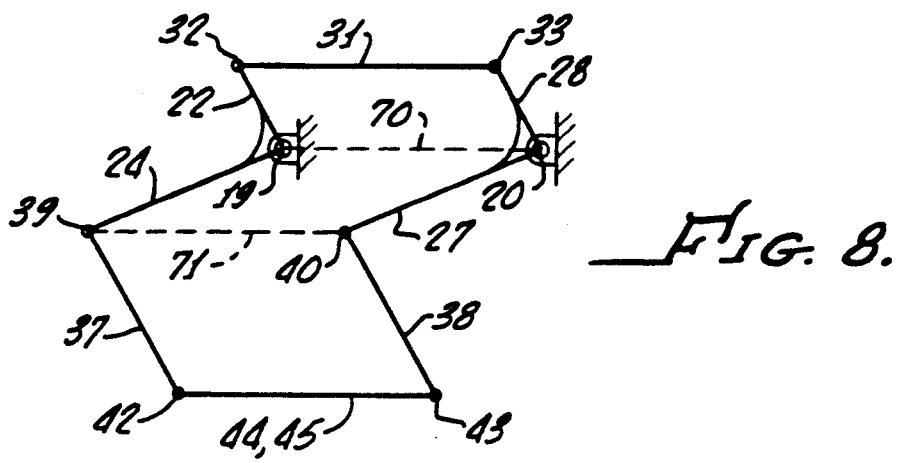
_Fig. 8._
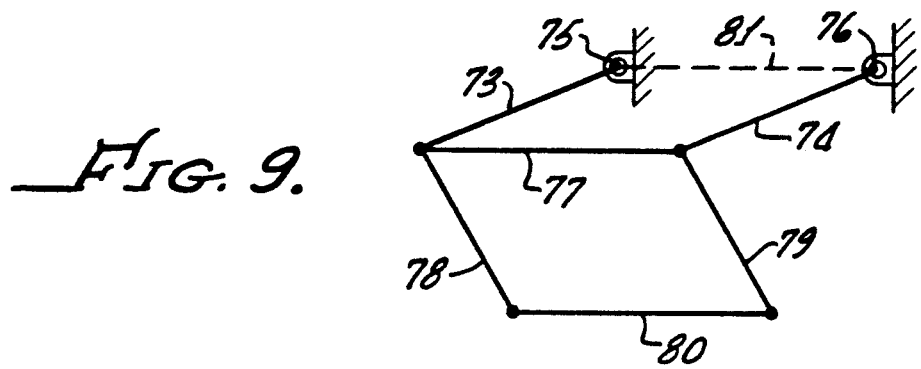
_Fig. 9._
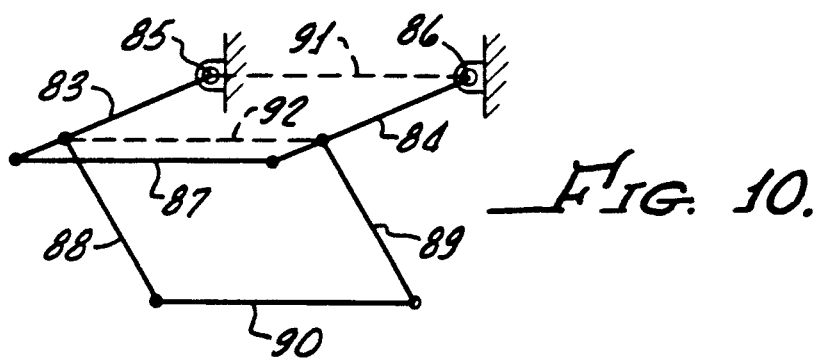
_Fig. 10._
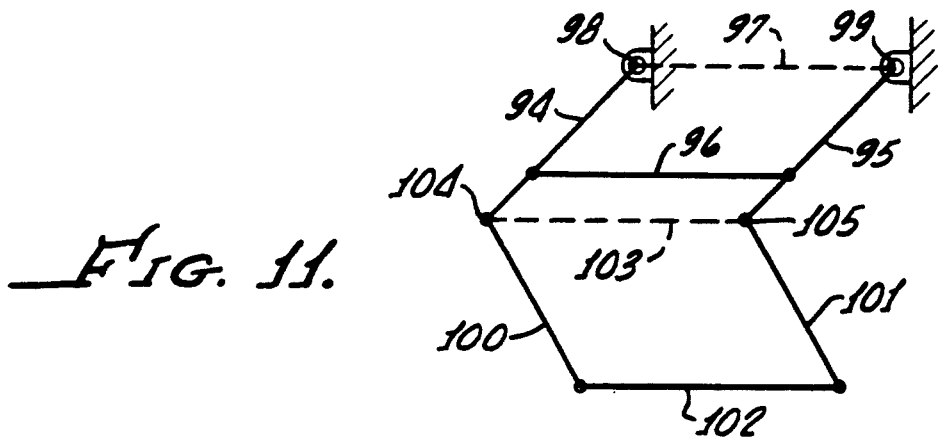
_Fig. 11._

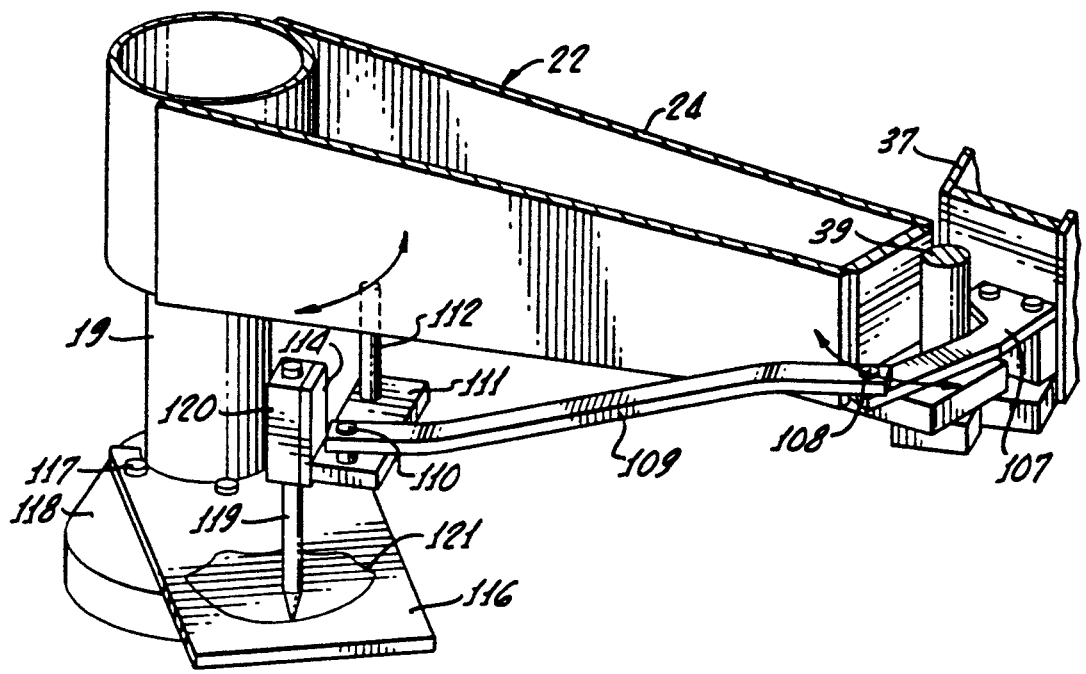
_Fig. 14._
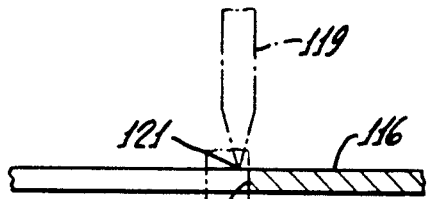
_Fig. 15._
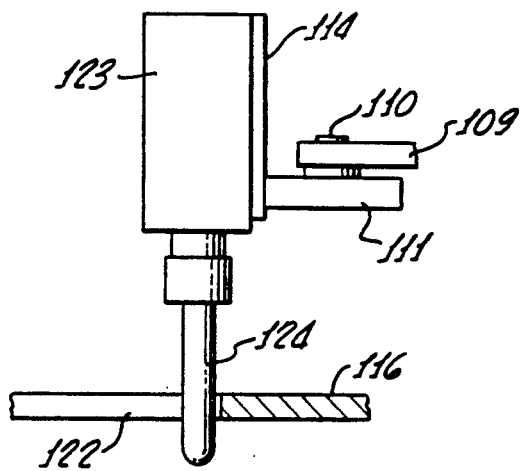
_Fig. 16._
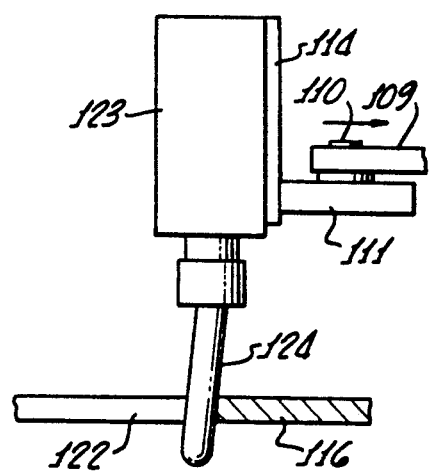
_Fig. 17._

ARRANGEMENT FOR PROVIDING PLANAR MOVEMENT OF A MACHINE TOOL

BACKGROUND OF THE INVENTION

In order to control movement of an element of a machine in a plane, it has been conventional practice to provide a set of ways extending linearly in one direction and another set of ways perpendicular to the first set of ways. Typical of this kind of machine are the drilling and routing machines used in the production of printed circuit boards. In such a machine, a combination of movements along the paths of the two sets of ways will position the machine element, such as a drill spindle, in a desired location A problem with such an arrangement is that ways which will permit accurate movement are expensive to produce. Even with the most meticulous construction, the ways permit accuracy of positioning which is less than ideal for various purposes. The speed of positioning the machine element along two sets of ways is limited and often is less than desired. Moreover, the mechanisms for movement of the machine element may become massive, bulky and expensive, especially for precision machine tools such as automatic drilling and routing machines.

SUMMARY OF THE INVENTION

The present invention provides a means of moving a machine element without the use of ways. The arrangement of this invention is cheaper to construct than conventional designs, faster in its operation, and much more accurate.

The invention makes use of the combination of two swivel mounted, variable length linear actuators, together with a pivoting linkage. The actuators are mounted at an angle relative to each other and by appropriate extension and retraction can together generate straight line motion or movement in any pattern in a plane. The linkage serves to maintain parallelism with the remainder of the machine, so that more than one operative device, such as drill spindles, may be operated simultaneously.

The linkage arrangement may comprise two parallelogram linkages connected together One link of one of the linkages is fixed relative to the machine. The other parallelogram linkage is connected to the first linkage. Two links of the second parallelogram linkage are parallel to the fixed link of the first linkage. The linear actuators converge from their swivel mountings to the second linkage. A machine tool, such as a drill spindle, is carried by the second parallelogram linkage Normally, the machine will include more than one such tool for simultaneous operation on different workpieces carried by the machine.

One use of this invention is in the construction of drilling and routing machines for printed circuit boards. Great accuracy of the positioning of the drilled holes is necessary for such machines Rapid operation increases production rates and reduces the number of machines required. These objectives, together with a reduced cost of constructing the machine, are achieved through the arrangement of this invention.

The invention is not limited to effecting movement of a drill spindle but also may be used for a variety of machines, such as a pick and place machine or one that performs an inspection operation. The term "machine tool" as used herein is intended to encompass such items.

BRIEF DESCRIPTION OF THE DRAWINGS

FIG. 4 enlarged fragmentary elevational view of one of the linear actuators;

FIG. 5 is a longitudinal sectional view taken along line 5—5 of FIG. 4;

FIG. 8 is a schematic view of the linkage of the machine;

FIGS. 9, 10 and 11 are schematic views of alternative linkages;

FIG. 14 is a fragmentary perspective view, partially in section, and with separation of some of the parts exaggerated for clarity, showing the first step in creating the limit switch arrangement;

FIG. 15 is a fragmentary sectional view of the plate which is cut to form an abutment for operation of the limit switch;

FIG. 16 is a fragmentary elevational view, partially in section, showing the limit switch in position within the opening in the plate;

FIG. 17 is a view similar to FIG. 16 showing the limit switch as it is actuated when the machine reaches the limit of its movement;

DETAILED DESCRIPTION OF THE INVENTION

Figure 1:
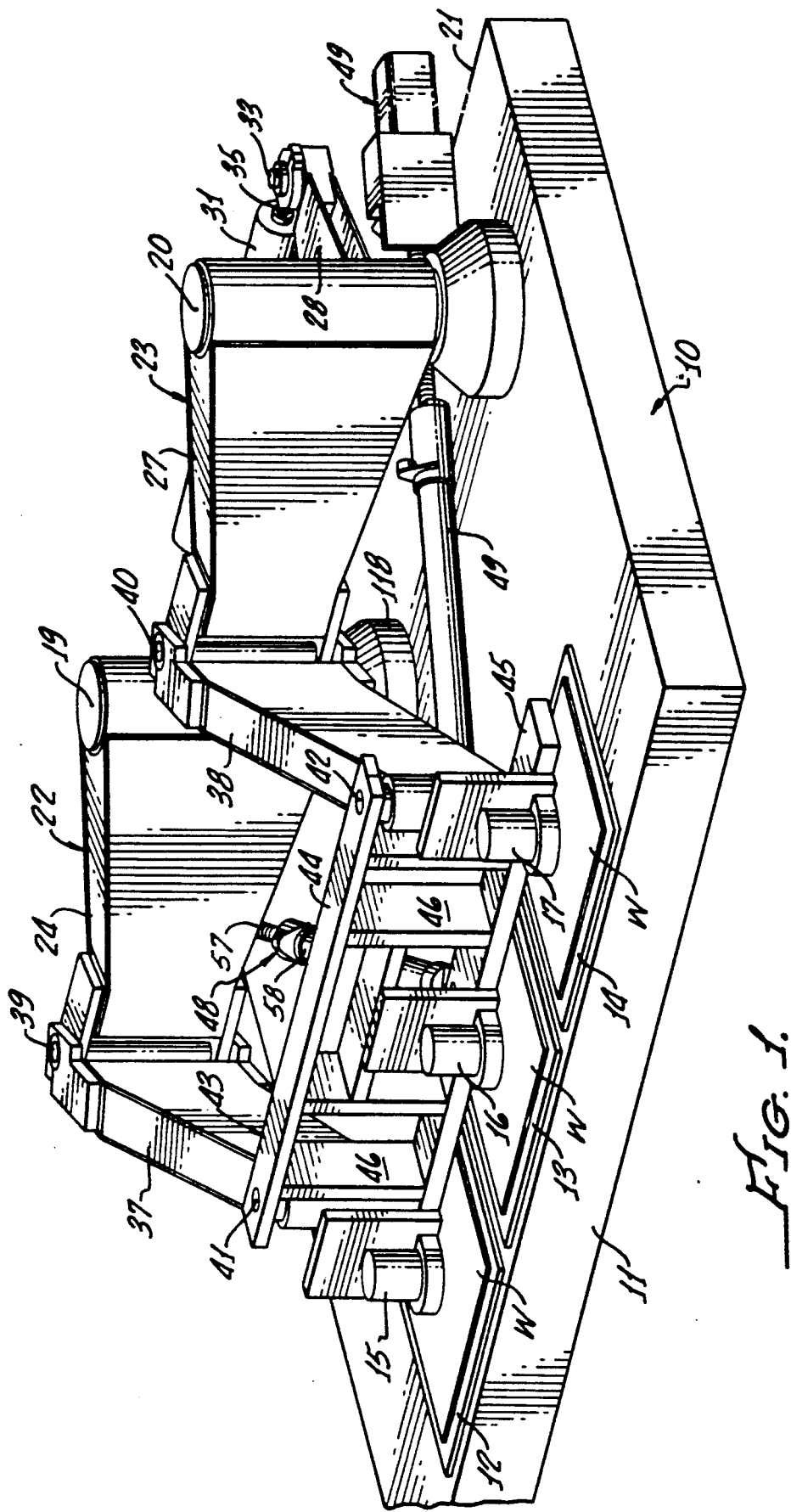
FIG. 1 is a perspective view of a drilling machine constructed in accordance with the invention, with the machine being seen from the front and one side.
Figure 2:
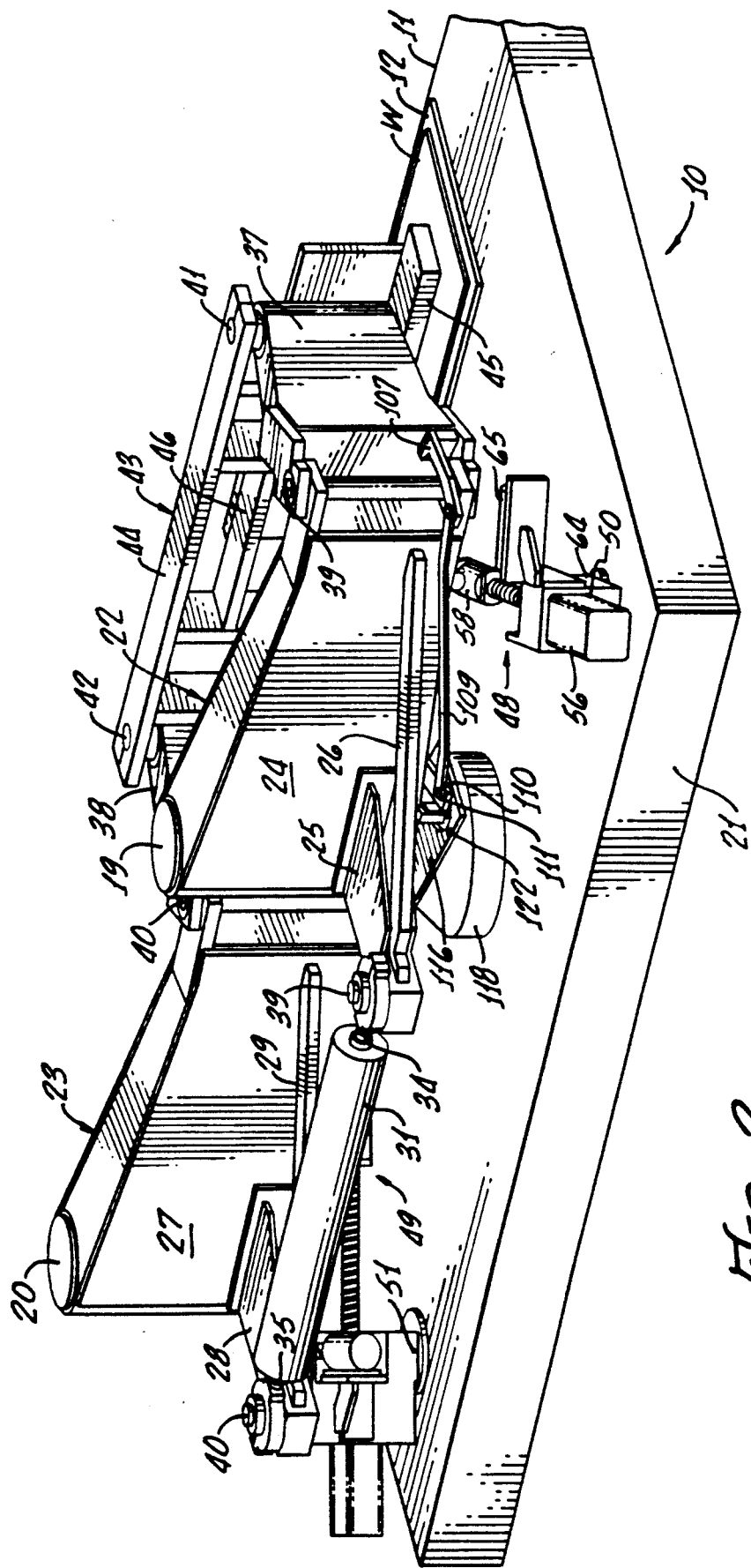
FIG. 2 is a respective view of the machine, as seen from the rear and one side.
Figure 3:
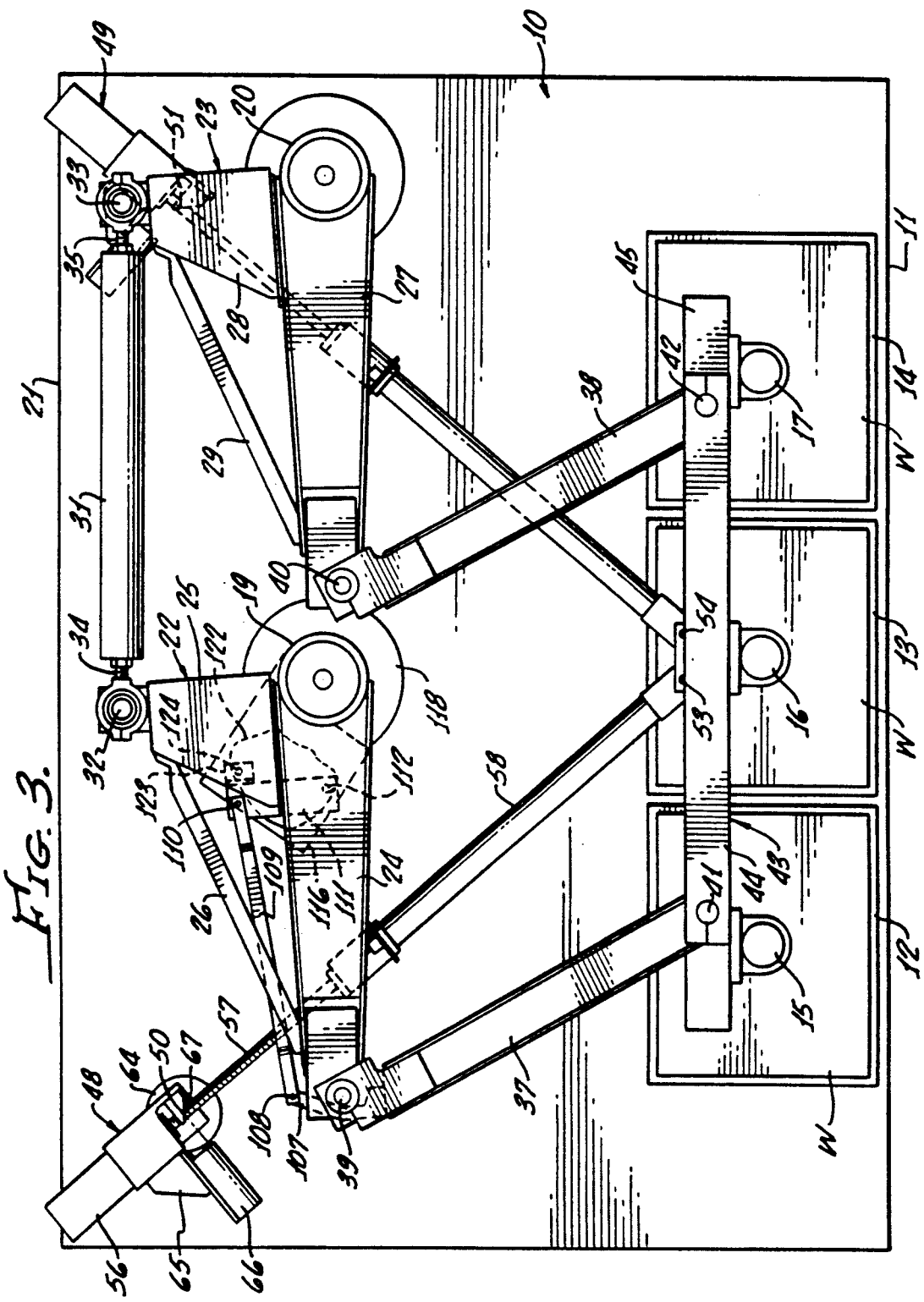
FIG. 3 is a top plan view of the machine.

Illustrated in FIGS. 1, 2 and 3 is a three-spindle drilling machine that includes a worktable 10, which may be a rectangular horizontal slab of granite. Supported on the flat upper surface of the worktable 10 near its forward edge 11 are three tooling plates 12, 13 and 14, each of which is adapted to support a workpiece W, such as a printed circuit board through which holes are to be drilled. Positioned above the tooling plates 12, 13 and 14 are machine tools, such as drilling and routing spindles 15, 16 and 17, respectively, the construction of which is not a part of this invention. Each of the spindles 15, 16 and 17 has a provision for vertical movement of a rotating drill bit for drilling holes in workpieces, such as printed circuit boards, on the tooling plates 12, 13 and 14. A spindle of this type is disclosed in my copending application Ser. No. 660,149, filed Feb. 22, 1991, for ARRANGEMENT FOR DRIVING A ROTARY TOOL. The spindles 15, 16 and 17 are supported for movement in the X-Y direction to any desired position by a linkage which is carried by spaced vertical support posts 19 and 20 that project upwardly from the worktable 10 near its rearward edge 21. The support posts 19 and 20 are equally spaced from the rearward edge 21 and, therefore, are equally spaced from the forward edge 11, as well. Rotatable horizontally about the vertical axes of the support posts 19 and 20 are bell cranks 22 and 23, respectively. The bell crank 22 includes a relatively long arm 24, positioned generally longitudinally of the worktable 10, and a shorter arm 25 which extends from the post 19 toward the rear of the machine The arms 24 and 25 are interconnected near their outer ends by a brace 26. The bell crank 23 is identical to the bell crank 22, including an arm 27, a shorter arm 28 extending toward the rear of the worktable, and a brace 29 connecting the outer end portions of the arms 27 and 28. The arms 24 and 27 of the bell cranks 22 and 23 are made as hollow box beams to achieve rigidity with minimum mass.

The ends of the shorter arms 25 and 28 of the two bell cranks are joined by a link 31 at pivotal connections 32 and 33 The link 31 is constructed as a tube with projecting threaded end parts 34 and 35 for adjustment in length. Once adjusted, the length of the link 31 remains fixed. The distance between the pivot points 32 and 33 is the same as the distance between the vertical axes of the vertical supports 19 and 20. The link 31 causes the bell cranks 22 and 23 to rotate simultaneously and equally about the vertical supports 19 and 20, and to always have identical rotational positions relative to the worktable 10.

Two links 37 and 38 of equal length connect at pivot points 39 and 40 to the outer ends of the arms 24 and 27, respectively. The links 37 and 38 also are constructed as hollow beams so that they are rigid but not heavy. The links 37 and 38 extend toward the front edge 11 of the worktable 10 and make pivotal connections 41 and 42 to a beam 43, made up of parallel upper and lower horizontal bars 44 and 45. The beam 43 is parallel to the worktable edge 11 and acts as another link in the system. The bars 44 and 45 are interconnected by bracing 46 and carry the three spindle assemblies 15, 16 and 17. The distance between the pivotal connections 41 and 42 is the same as the spacing between the pivot points 39 and 40. As a result, the two links 37 and 38 are parallel. The bars 44 and 45 of the beam 43 are parallel to a line interconnecting the pivot points 39 and 40, as well as to a line that interconnects the axes of vertical supports 19 and 20.

The linkage is moved by two linear actuators 48 and 49, pivotally mounted on the table 10 at spaced locations 50 and 51, respectively, near the two rearward corners of the worktable 10. The linear actuators 48 and 49 converge from their swivel mountings 50 and 51 to pivotal connections 53 and 54 to the lower horizontal bar 45 near the front edge 11 of the worktable 10. The pivotal connections 53 and 54 are next to each other.

The construction of the linear actuator 48, which is identical to that of the actuator 49, is illustrated in FIGS. 4 and 5. An electric motor 56 drives a lead screw 57 the outer end of which is received within a tube 58. A ball bearing support 59 inside the tube supports the outer end of the lead screw 57. A preloaded ball nut receives the lead screw 57 so that rotation of the lead screw 57 will either extend the tube 58 or retract it relative to the pivotal mounting 50.

The pivotal mounting 50 includes a vertical post 61, rotatable in bearings 62 and 63, which are held in a sleeve 64 that fits within an opening in the worktable 10.

The post 61 carries a bracket 65 that supports the motor 56. A laser 66 is positioned perpendicular to the lead screw 57 and, by a mirror 67, transmits a beam to a reflector 68. The laser 66, therefore, provides a means for ascertaining the exact amount of extension of the tube 58 relative to the pivotal mounting 50. The laser is used in conjunction with a computer to control the rotation of the lead screws.

In operation, the linear actuators 48 and 49 are appropriately extended or retracted to cause movement of the linkage such that the spindles 15, 16 and 17 are moved to desired locations over the tooling plates 12, 13 and 14. Horizontal movement in any direction can be obtained in this manner. The beam 43 always remains parallel to a line that interconnects the vertical axes of the posts 19 and 20, so that their angular relationship to the workpieces W is maintained as the linkage moves. The spindles may be positioned with great accuracy and are repositioned very rapidly in a drilling sequence. Accuracy and speed surpass what is obtainable with a machine employing conventional ways.

In the functioning of the linkage that moves the spindles, movement in the X direction is achieved by rotation of the two links 37 and 38. Movement in the Y direction results from the rotation of the crank arms 24 and 27, which extend generally longitudinally of the worktable 10.

Figure 6:
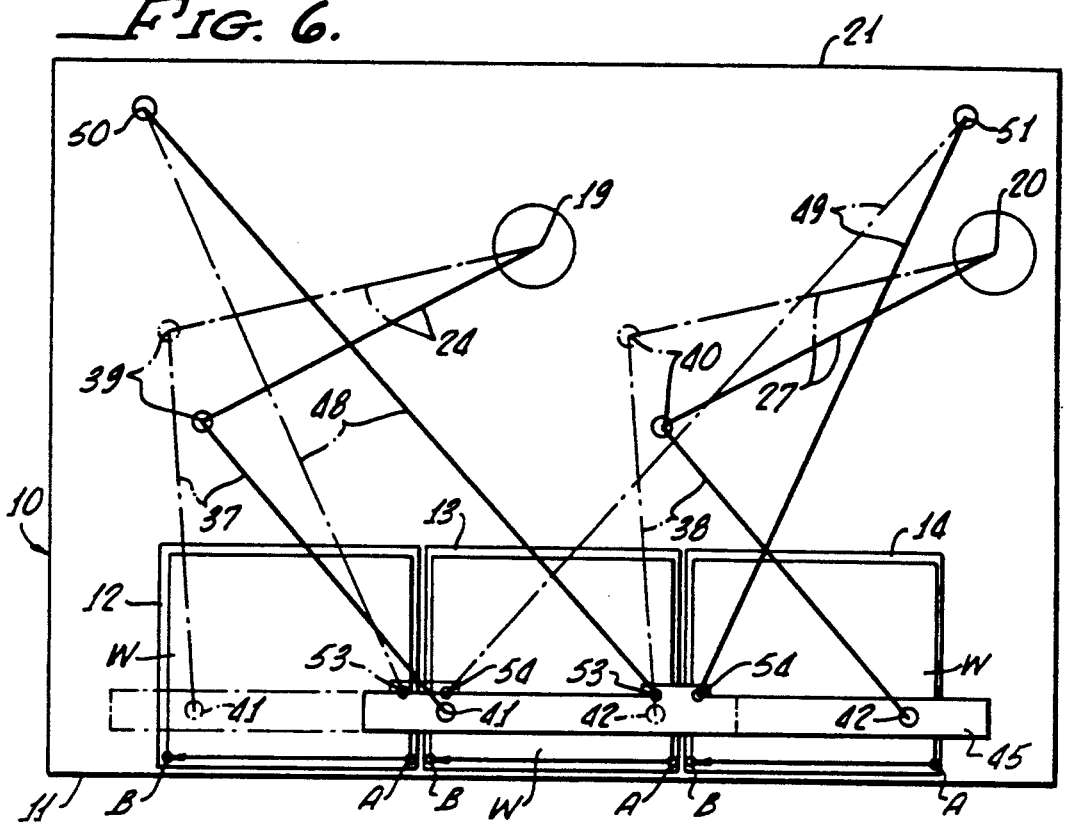
FIG. 6 is a schematic view showing the mechanism of the machine in two of its operative positions.
Figure 7:
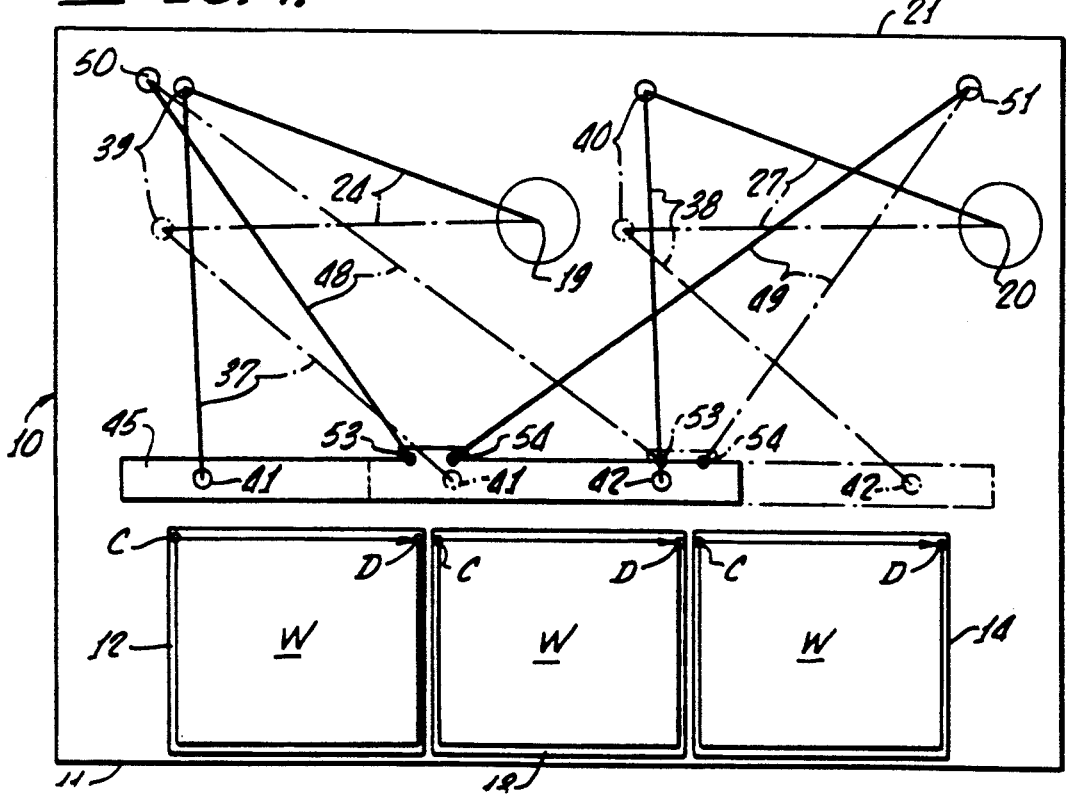
FIG. 7 is a view similar to FIG. 6 with the machine in two other positions.

The operation of the mechanism is illustrated schematically in FIGS. 6 and 7 where the extreme positions are shown for locating the spindles 15, 16 and 17 at the four corners of the tooling plates 12, 13 and 14. The crank arms 22 and 28, and the link 31 are omitted in these views for clarity.

In FIG. 6, the solid lines denote the positions of the various components in locating the spindles at the forward right-hand corners of the tooling plates, identified as position A. In this condition, the linear actuator 48 is extended a greater distance than is the actuator 49. Further extension of the actuator 49 and some retraction of the actuator 48 will shift the spindles to position B at the forward left-hand corners of tooling plates 12, 13 and 14. In this movement from position A to position B, the crank arms 24 and 27 are moved in a clockwise direction around the pivotal mountings 19 and 20. The links 37 and 38 also are moved clockwise about their connections 39 and 40 to the crank arms 24 and 27.

In FIG. 7 the solid line position locates the spindles over the inner left-hand corners of the tooling plates 12, 13 and 14, position C, while position D results from the phantom line movement which locates the spindles at the inner right-hand corners of the tooling plates. In moving from position C to position D, the linear actuator 48 is extended and the actuator 49 is retracted. The crank arms 24 and 27 move counterclockwise about the vertical mounts 19 and 20 and the links 37 and 38 move counterclockwise about their pivotal mountings 39 and 40.

As shown schematically in FIG. 8, the mechanism of FIGS. 1, 2 and 3 provides in effect two parallelogram linkages. One is made up of the two crank arms 22 and 28, the link 31 that interconnects them, and a line 70 that extends between the two fixed vertical axes 19 and 20. The link 70, of course, is stationary while the other three links of this parallelogram linkage move in response to actuation of the linear actuators 48 and 49. The second parallelogram linkage consists of the two links 37 and 38, the link 43 that supports the spindles and a line 71 extending between the pivotal connections 39 and 40 where the links 37 and 38 join the crank arms 24 and 27. In this arrangement, the links 31, 70, 71 and 44, are parallel. The crank arms 24 and 27 serve to interconnect the two parallelogram linkages, and enable one to move the other, but are not a part of either. However, arms 24 and 27, together with lines 70 and 71, could be regarded as another parallelogram linkage.

Although it is preferred to connect the linear actuators 48 and 49 to the front link 43, these actuators also can be connected to the two links 37 and 38 in an operative system. One of the linear actuators then will connect to the link 37 and the other to the link 38. Instead of converging from their swivel mountings to the linkage, the actuators 48 and 49 may diverge to the linkage or even be on opposite sides of the beam 43. The actuators must be nonparallel in any event so that their combined movements will create universal planar movement of the driven linkage.

Other linkages, which may not have the practical advantages of the linkage of FIG. 8, nevertheless also may be used in providing the motion for drill spindles or other devices which are to be moved in a given plane. Certain examples, out of various possibilities, are illustrated in FIGS. 9, 10 and 11.

As shown in FIG. 9 two links 73 and 74 are connected to fixed pivot points 75 and 76. The other ends of the links 73 and 74 are interconnected by an additional link 77. Parallel links 78 and 79 also pivotally connect to the outer ends of the links 73 and 74. The opposite ends of the links 78 and 79 are interconnected by a link 80. Here there are again two parallelogram linkages, one being defined by the links 73, 74, 77 and a line 81 interconnecting the fixed pivot points 75 and 76. The link 77 also is part of the other parallelogram linkage which includes additionally the links 78, 79 and 80. The spindles are carried by the link 80, which is parallel to the link 77 and to the link 81. The parallel relationship of the link 80 to the links 77 and 81 is maintained during movement of the linkage Linear actuators will converge from swivel mountings to the link 80, or alternatively to the links 78 and 79.

In the arrangement of FIG. 10, links 83 and 84 can rotate about fixed pivot points 85 and 86 and at their outer ends are connected to a link 87. Additional links 88 and 89 are connected by the links 83 and 84 inwardly of their outer ends. Link 90 joins the outer ends of the links 88 and 89. The first parallelogram linkage in this arrangement includes the links 83, 84, 87 and a line interconnecting the fixed pivot points 85 and 86. The second parallelogram linkage includes the links 88, 89, 90 and a link 92, which is a line that interconnects the inner ends of the links 88 and 89. The link 90, which carries the machine tool, is parallel to the links 87 and 91.

In FIG. 11 one parallelogram linkage includes the links 94, 95, 96 and a line 97 connecting two fixed pivot points 98 and 99. The other parallelogram linkage is made up of links 100, 101, 102 and a line 103 connecting the pivot points 104 and 105 where the links 101 and 102 join extensions of the links 94, 95.

In all of these examples, there are two parallelogram linkages which are connected together. In one of the parallelogram linkages one link is fixed relative to the worktable. The other parallelogram linkage is driven by the nonparallel linear actuators and carries the machine tool. Two links of one parallelogram linkage are parallel to two links of the other parallelogram linkage under all conditions. However, the other two links of the first parallelogram linkage are not parallel to the other two links of the second parallelogram linkage.

A limit switch arrangement is provided to shut off the power to the linear actuators 48 and 49 in the event that the mechanism advances too far in any direction. This is accomplished by means of only one switch rather than a multiplicity of switches as required on conventional machines.

In order to provide for the limit switch, a short bracket 107, seen in FIG. 14 as well as FIGS. 1 and 2, is attached to the link 37 adjacent its pivotal connection 39 to the arm 24. The bracket 107 extends toward the rear of the machine and makes a pivotal connection 108 to one end of a link 109. The opposite end of the link 109 makes a pivotal connection 110 to a shorter flat horizontal arm 111, which, in turn, makes a pivotal connection 112 to the underside of the arm 24 of the bell crank 22. A vertical support 114 extends from one edge of the plate 111.

A flat plate 116 is attached by screws 117 to the support 118 for the vertical pivot 19. This positions the plate 116 in a horizontal plane beneath the vertical support 114.

The next step in providing for a limit switch is to attach a marker 119, such as a pen or pencil, to the support 114 so that it touches the upper surface of the plate 116 (see FIGS. 14 and 15 In FIG. 14 the spacing between the arms 24 and 111 is exaggerated for clarity). The marker 119 may extend through an opening in a block 120 that is attached to the support. Then the machine is operated to cause the mechanism to traverse the outer boundary of its intended movement under operating conditions. As this is done, movement of the arms 24 and 37, through the bracket 107, link 109 and arm 111, causes the marker 119 to move and inscribe a line 121 on the plate 111 indicating the positions of the marker 119. The line 121 defines an enclosed pattern of irregular shape. This pattern is relatively small because the marker 119 experiences much less movement than the beam 43 and the spindle that it carries as the mechanism is moved to its limits.

Figure 12:
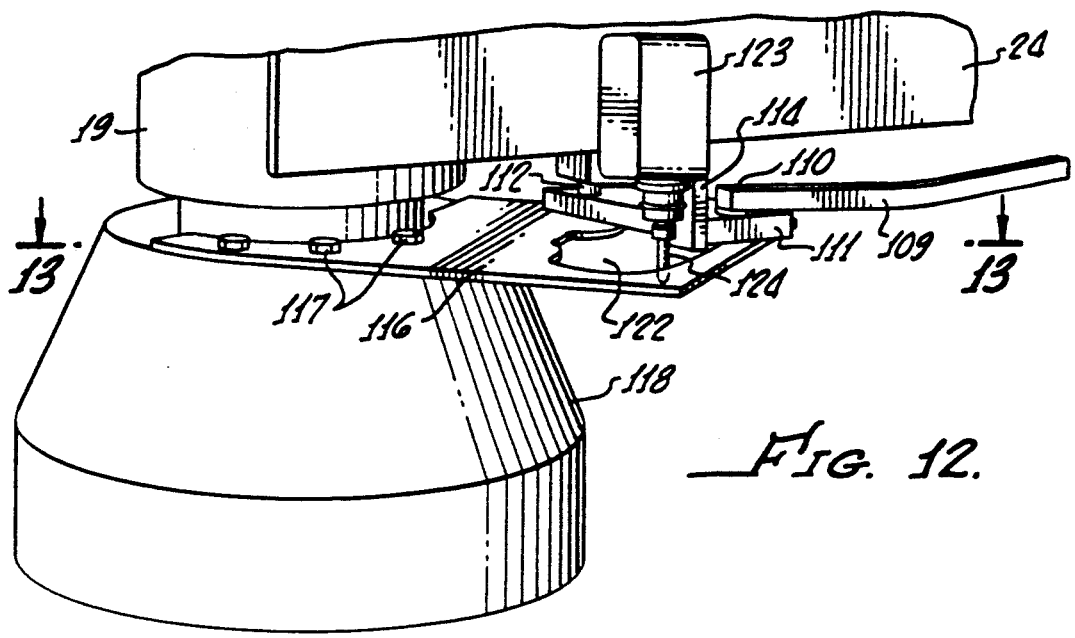
FIG. 12 is an enlarged fragmentary perspective view of the limit switch arrangement for limiting the movement of the machine.
Figure 13:
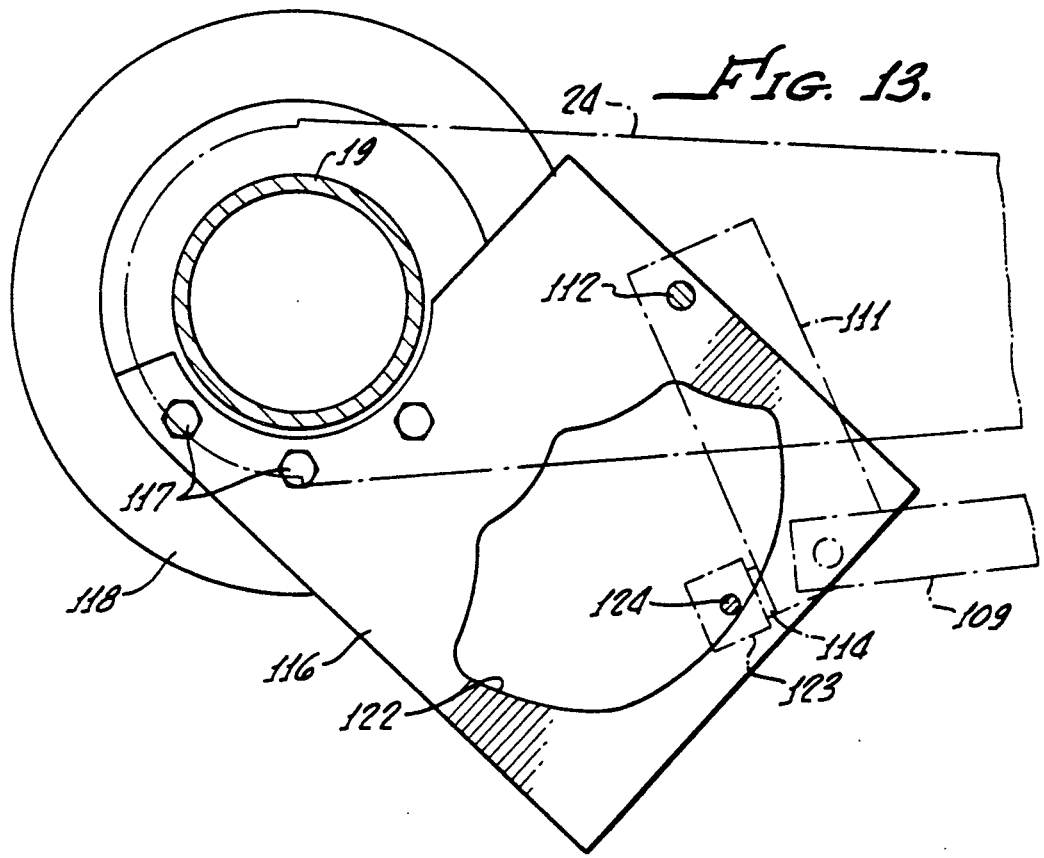
FIG. 13 is a sectional view taken along line 13—13 of FIG. 12.

The plate 116 then is removed and a cut is made following generally the pattern of the line 121, but slightly outside of it, as indicated in FIG. 15. This provides an opening 122 in the plate 116. The plate 116 then is replaced on the support 118 and the marker 119 and block 120 are removed and replaced with a limit switch 123, as seen in FIGS. 12, 13 and 16. The actuating arm 124 of the limit switch 123 extends into the opening 122. Movement of the arm 124 in any direction will trip the switch 123.

As a result, if ever the machine should be operated so that the beam 43 will reach its intended limit in any direction, the limit switch 123 will be tripped by the reaction of the abutment formed by the edge of the opening 122 against the actuating arm 124 of the switch, as seen in FIG. 17. It is because the actuating arm 124 has a finite width and the marker 119 inscribes a line on the plate 116, that the cut 122 is made to a slightly larger dimension than the line 121 so that the switch 123 is tripped at a location which corresponds to the limit of machine travel represented by the line 121. The limit switch 123 is wired in series with the motors of the linear actuators 48 and 49 or connected to a disable circuit so that when the switch is opened by such movement of the actuating arm 124, the circuits to the linear actuators are interrupted and the machine will shut down. Thus, by a very simple arrangement, the movement of the machine is kept within desired limits.

Figure 18:
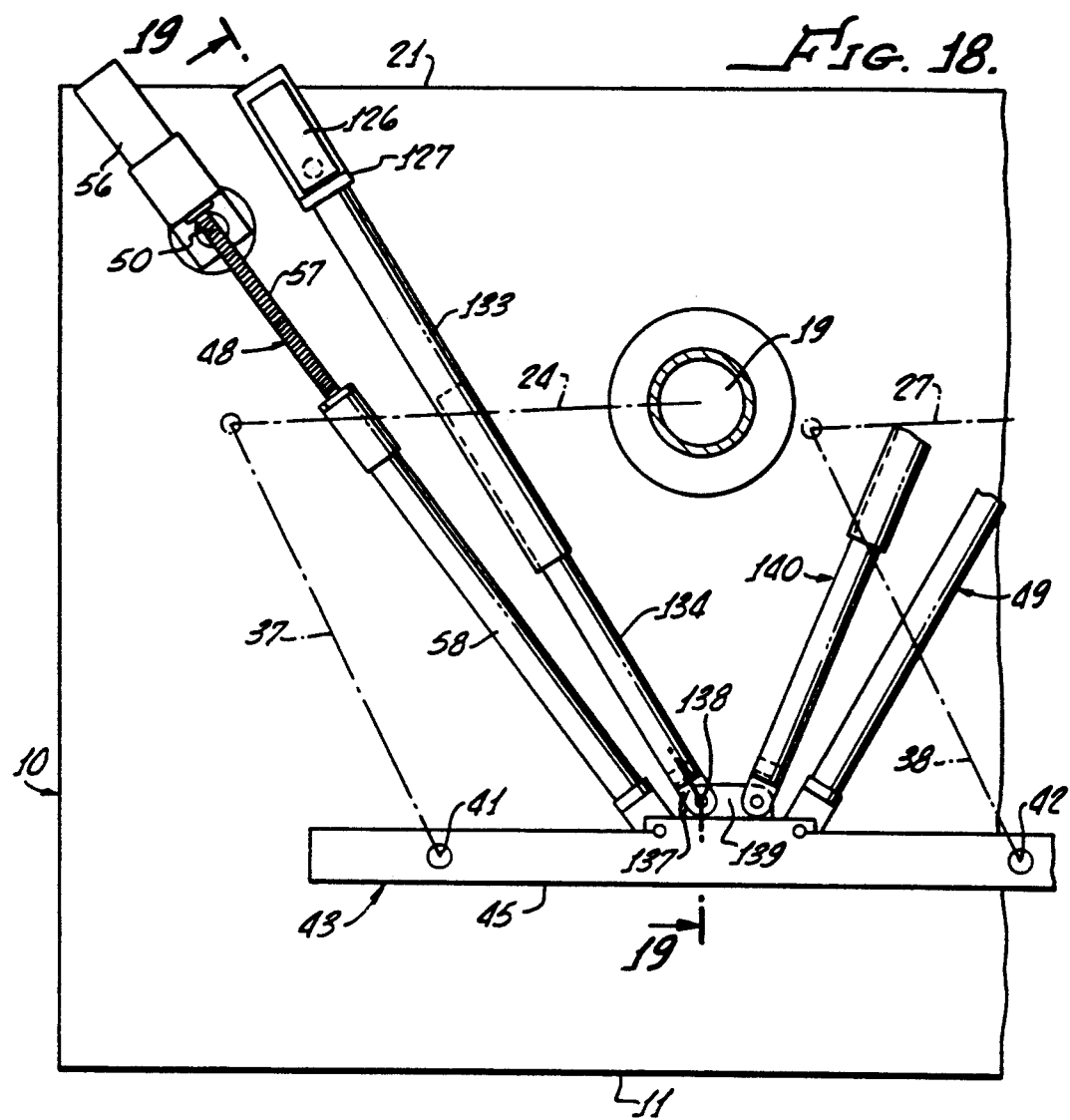
FIG. 18 is a fragmentary top plan view illustrating a modified arrangement for the lasers that control the actuators.
Figure 19:
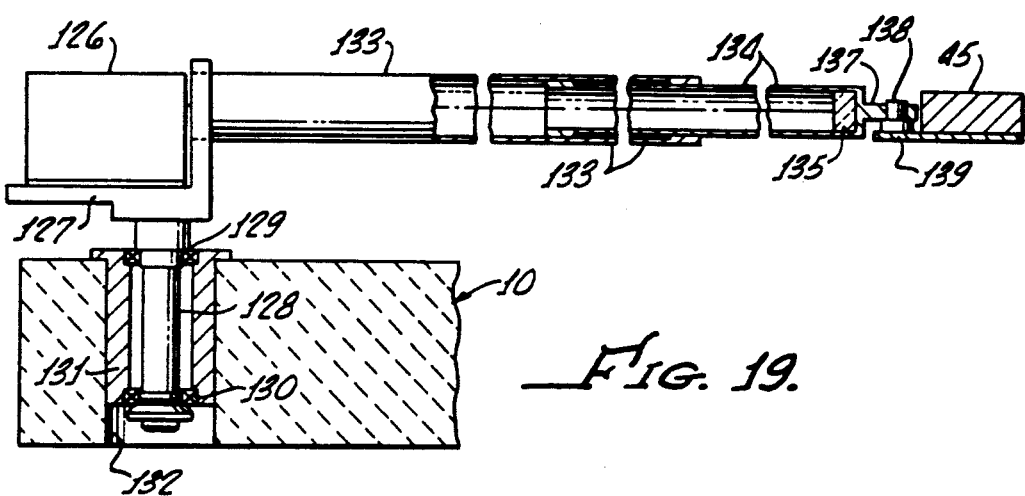
FIG. 19 is an enlarged fragmentary sectional view taken along line 19—19 of FIG. 18.

The arrangement for mounting the lasers illustrated in FIGS. 18 and 19 assures accurate positioning of the beam 43, and hence the machine tools which it carries, in the event the operation of the linear actuators is not perfectly true. For example, if the lead screw 57 of the linear actuator 48 is bent slightly, the reflector 68 will not move in a precise linear path in the previously described embodiment. This can result in errors in positioning the beam 43 and prevents exact repeatability of results.

As shown in FIGS. 18 and 19 for the linear actuator 48, a laser 126 is mounted horizontally on a bracket 127 carried by a vertical post 128 which is located near the swivel mounting 50 for the actuator 48. The post 128 is rotatable in bearings 129 and 130 which are held in a sleeve 131 that fits within a vertical opening 132 in the worktable 10. The bracket 127 is L-shaped, having a vertical portion that supports one end of a horizontal tube 133. A second tube 134 telescopes into the outer end of the tube 133 with a close fit. A corner mirror 135 is located within the tube 134 near its outer end.

At the outer end of the tube 134 is a bracket 137 projecting from the tube to make a pivotal connection 138 to a plate 139 carried by the lower bar 45 near the center of the beam 43. Therefore, as the mechanism is actuated by the actuators 48 and 49, the tube 134 moves with the beam 43 and is either extended from or retracted into the tube 133. As this occurs, the laser swivels about the axis of the post 128. The movement of the tube 134 relative to the tube 133 causes the corner mirror 135 to move in an accurate linear path with respect to the laser 126 as the distance between them varies.

The laser beam travels through the telescoped tubes 133 and 134 to be reflected by the mirror 135 and return. This generates a signal, used in controlling the actuators, indicating the position of the mirror 135 and hence the machine tools carried by the beam 43. The signal depends only upon the position of the mirror 135 as moved by the beam 43 and is not affected by the way in which the actuator 48 operates. The telescoping tubes of the laser assembly need not be parallel to the actuator 48, but should be at an angle relative to the beam 43 and not perpendicular to it.

A similar telescoping tubes and laser assembly 140 is provided adjacent the actuator 49.

The foregoing detailed description is to be clearly understood as given by way of illustration and example only, the spirit and scope of this invention being limited solely by the appended claims

What is claimed is:

1. An arrangement for providing universal planar movement of a machine tool adjacent a workpiece comprising
    support means adapted to support a workpiece in a predetermined location;
    a duality of linear actuators,
    means for pivotally connecting one end portion of each of said linear actuators to said support means for pivotal movement of said linear actuators relative thereto;
    linkage means carried by said support means for permitting movement of at least one link thereof in any direction in a predetermined plane and adjacent said predetermined location, while maintaining parallelism with a predetermined line and confining said movement to said predetermined plane,
    the opposite ends of said linear actuators being pivotally connected to said linkage,
    said linear actuators being nonparallel, whereby selective extension and retraction of said linear actuators causes such movement of said one link, and
    at least one machine tool carried by said one link for movement therewith adjacent said predetermined location for performing an operation with respect to a workpiece so supported on said support means.

2. A device as recited in claim 1 in which said opposite ends of said linear actuators are in juxtaposition.

3. A device as recited in claim 1 including in addition at least one additional machine tool carried by said one link for also performing an operation on a workpiece so supported by said support means.

4. An arrangement for providing universal planar movement of a machine tool adjacent a workpiece comprising
    a worktable having a planar upper surface adapted to support a workpiece,
    a linkage carried by said worktable for planar movement above and parallel to said upper surface,
    said linkage including first and second parallelogram linkages connected together,
    said first parallelogram linkage including one link fixed relative to said worktable,
    said second parallelogram linkage including one link parallel to said fixed link,
    a machine tool carried by said second parallelogram linkage and movable therewith,
    a duality of linear actuators, means for connecting one end portion of each of said linear actuators to said worktable for pivotal movement above and parallel to said upper surface,
    the opposite ends of said linear actuators being pivotally connected to said second parallelogram linkage,
    said linear actuators being nonparallel, whereby selective extension and retraction of said linear actuators can cause said machine tool to move in any direction in a plane adjacent a workpiece carried by said worktable.

5. A device as recited in claim 4 in which said machine tool is carried by said one link of said second parallelogram linkage, and said opposite ends of said linear actuators are connected to said one link of said second parallelogram linkage.

6. A device for providing X-Y movement of a machine tool comprising
    table means defining a planar surface adapted to support a workpiece at a predetermined location thereon,
    a pair of bell cranks,
    means for pivotally connecting said bell cranks to said table means at fixed locations spaced a predetermined distance apart so that said bell cranks can pivot parallel to said surface,
    a first link parallel to a line extending between said fixed locations and interconnecting two arms of said bell cranks at locations spaced apart said predetermined distance,
    a pair of second links pivotally connected to the other arms of said bell cranks at locations spaced apart said predetermined distance,
    a third link pivotally connected to said second links at locations remote from said connections of said other arms of said bell cranks to said second links and spaced apart said predetermined distance, a machine tool carried by said third link for performing an operation on a workpiece supported on said table, and actuator means for moving said third link such that said machine tool can be moved in any direction parallel to said surface.

7. A device as recited in claim 6 in which said actuator means includes a duality of nonparallel linear actuators pivotally connected to said third link.

8. A device as recited in claim 7 in which said linear actuators are pivotally connected to said table means and are convergent toward said third link.

9. A device as recited in claim 6 in which said two arms extend from said fixed locations generally away from said predetermined location, and said second links extend from said other arms of said bell cranks generally toward said predetermined location.

10. A device for providing movement of a machine tool relative to a workpiece in any direction in a plane comprising support means for supporting a workpiece, a first parallelogram linkage, said first parallelogram linkage including means for providing two spaced pivot points fixed relative to said support means such that one link of said first parallelogram linkage extends between said two pivot points and two other links of said first parallelogram linkage are connected to said two pivot points, a second parallelogram linkage, means for connecting said second parallelogram linkage to said first parallelogram linkage such that one link of said second parallelogram linkage is parallel to said one link of said first parallelogram linkage, means for carrying at least one machine tool on said second parallelogram linkage, and actuator means for moving said second parallelogram linkage such that said machine tool can perform an operation with respect to a workpiece supported by said support means.

11. A device as recited in claim 10 which includes a duality of linear actuators convergent toward and pivotally connected to said second parallelogram linkage.

12. A device recited in claim 11 in which said linear actuators are electrically driven screw-type actuators.

13. The method of moving a machine tool in a plane adjacent a workpiece comprising the steps of positioning a workpiece on a support, pivotally connecting a linkage to said support which linkage has a link capable of universal planar movement adjacent said workpiece and includes a plurality of parallelogram linkages, arranging two linear actuators such that each of said linear actuators has one end pivotally connected to said support and an opposite end pivotally connected to said linkage, and said linear actuators are nonparallel, positioning at least one machine tool on said link so that said machine tool can experience such movement with said link, and selectively extending and retracting said linear actuators for causing predetermined planar movement of said link and said machine tool.

14. The method as recited in claim 13 in which said linear actuators are positioned to converge from said one ends thereof to said opposite ends thereof.

15. The method as recited in claim 13 in which said opposite ends of said linear actuators are pivotally connected to said link for thereby making said pivotal connection to said linkage.

16. The method as recited in claim 15 in which said opposite ends of said linear actuators are located in juxtaposition with each other in so pivotally connecting said linear actuators to said link.

17. The method as recited in claim 15 including the connection of said link in said linkage such that said link maintains a constant angular relationship relative to said support during said universal planar movement thereof.

18. The method as recited in claim 15 in which two pivotal connections are made at spaced fixed locations on said support for so pivotally connecting said linkage to said support.

19. The method as recited in claim 18 in which said link is made to a length equal to the distance between said spaced fixed locations 20. The method as recited in claim 15 in which said linkage is made to include a plurality of parallelogram linkages.

21. The method as recited in claim 15 in which said support is formed to have a support surface parallel to the plane of said planar movement of said link, and said workpiece is positioned on said support surface.

22. The method of moving a machine tool comprising the steps of positioning a workpiece on a support, providing a first parallelogram linkage two pivot points of which are fixed in position relative to said support, providing a second parallelogram linkage pivotally connected to said first parallelogram linkage such that said second parallelogram linkage provides a link parallel to a line interconnecting said two pivot points of said first parallelogram linkage and such that said link of said second parallelogram linkage is positionable adjacent said workpiece, and movable in any direction in a plane adjacent said workpiece, mounting a machine tool for movement with said link of said second parallelogram linkage, and then moving said second parallelogram linkage such that said machine tool is selectively positioned relative to said workpiece such that said machine tool can perform an operation with respect to said workpiece.

23. The method as recited in claim 22 in which for so moving said second parallelogram linkage, two linear actuators are provided and arranged to be nonparallel and engage said second parallelogram linkage, whereby movement of said linear actuators causes movement of said second parallelogram linkage.

24. The method as recited in claim 22 in which for so moving said second parallelogram linkage, two linear actuators are provided and each is pivotally connected to said support at one end thereof and pivotally connected to said link of said second parallelogram linkage at the opposite end thereof, said linear actuators being arranged to converge toward said connection to said link of said second parallelogram linkage.

25. The method of moving a machine tool in a plane adjacent a workpiece comprising the steps of providing a support having a horizontal flat support surface, positioning a workpiece on said support surface, attaching a pair of bell cranks to said support for rotation about fixed vertical spaced axes, pivotally interconnecting two arms of said bell cranks so that said bell cranks rotate together and have the same angular positions relative to said support surface, pivotally connecting one end of a link to each of the other arms of said bell cranks with said links being made of equal lengths, pivotally connecting the opposite ends of said links to a beam such that said beam is capable of universal planar movement over said workpiece, pivotally connecting a pair of linear actuators at one end portion thereof to said support so that said actuators can rotate in a horizontal plane over said support surface, pivotally connecting the opposite ends of said actuators to said beam such that said actuators are convergent toward said beam and selective extension and retraction of said actuators will cause such movement of said beam, and positioning at least one machine tool on said beam so that said machine tool will experience universal planar movement over said workpiece when said actuators are so selectively extended and retracted.

26. The method of limiting the movement of the mechanism of a machine that includes a mechanism movable relative to a support and power operated means for so moving said mechanism, comprising the steps of attaching a position indicating means in a first predetermined location such that it moves with said mechanism, positioning a surface fixed relative to said support in a second predetermined location adjacent said indicating means, moving said mechanism so as to position said mechanism at all of the intended limits of the movement of said mechanism relative to said support so as to cause said indicating means to produce a pattern on said surface, removing said indicating means and said surface, forming an abutment having substantially the shape of said pattern, providing a power interruption means which when engaged will interrupt the power to said power operated means, then attaching said power interruption means substantially in said first predetermined position, and positioning said abutment means substantially in said second predetermined location such that when said mechanism is moved to said intended limits of its movement, said power interruption means will engage said abutment and will interrupt the power to said power operated means, thereby to halt movement of said mechanism 27. The method as recited in claim 26 in which said mechanism includes a portion adapted to support a machine tool, and said position indicating means and said power interruption means are attached to said mechanism at a location which experiences substantially less movement than does said portion of said mechanism when said mechanism is moved.

28. The method as recited in claim 26 in which for said surface a flat plate is provided adjacent said mechanism, and in which for said abutment an opening is formed in said plate having substantially the shape of said pattern and the edge of said opening forms an abutment.

29. The method as recited in claim 26 in which said power operated means is electrically energized, and for said power interruption means a limit switch is provided, whereby actuation of said limit switch interrupts the supply of electricity to said power operated means for so causing said power operated means to stop operating said mechanism.

30. An arrangement for providing universal planar movement of a machine tool device comprising support means adapted to support a workpiece in a predetermined plane, a duality of linear actuators, means for pivotally connecting one end portion of each of said linear actuators to said support means for pivotal movement of said linear actuators in a plane parallel to said predetermined plane, a linkage carried by said support means and arranged to provide movement of links thereof in any direction in a plane parallel to said predetermined plane, the opposite ends of said linear actuators being pivotally connected to one link of said linkage, said linear actuators being nonparallel, whereby selective extension and retraction of said linear actuators provides such movement of said links of said linkage, and a machine tool carried by said linkage for movement therewith for performing an operation on a workpiece so supported by said support means.

31. A device as recited in claim 30 in which said machine tool is a drilling and routing spindle.

32. A device as recited in claim 30 in which said support means includes a planar surface for so supporting a workpiece in a predetermined plane.

33. A device as recited in claim 30 in which said linear actuators are convergent from said one end portions thereof to said opposite ends thereof.

34. An arrangement for providing universal planar movement of a machine tool device comprising support means adapted to support a workpiece in a predetermined plane, a duality of linear actuators, means for pivotally connecting one end portion of each of said linear actuators to said support means for pivotal movement of said linear actuators in a plane parallel to said predetermined plane, a linkage, two fixed spaced connecting means for connecting said linkage to said support means whereby said linkage is carried by said support means and arranged to provide movement of links thereof in any direction in a plane parallel to said predetermined plane, one link of said linkage being parallel to a line interconecting said connecting means, the opposite ends of said linear actuators being pivotally connected to said linkage, said linear actuators being nonparallel, whereby selective extension and retraction of said linear actuators provides such movement of said links of said linkage, and a machine tool carried by said linkage for movement therewith for performing an operation on a workpiece so supported by said support means.

35. A device as recited in claim 34 in which said one link has a length equal to the distance between said connecting means.

36. An arrangement for providing universal planar movement of a machine tool device comprising support means adapted to support a workpiece in a predetermined plane, a duality of linear actuators, means for pivotally connecting one end portion of each of said linear actuators to said support means for pivotal movement of said linear actuators in a plane parallel to said predetermined plane, a linkage carried by said support means and arranged to provide movement of links thereof in any direction in a plane parallel to said predetermined plane, said linkage including a plurality of parallelogram linkages, the opposite ends of said linear actuators being pivotally connected to one link of said linkage, said linear actuators being nonparallel, whereby selective extension and retraction of said linear actuators causes such movement of said links of said linkage, and a machine tool carried by said linkage for movement therewith for performing an operation on a workpiece so supported by said support means.

37. An arrangement for providing universal planar movement of a machine tool device comprising support means adapted to support a workpiece in a predetermined plane, a duality of linear actuators, means for pivotally connecting one end portion of each of said linear actuators to said support means for pivotal movement of said linear actuators in a plane parallel to said predetermined plane, a linkage carried by said support means and arranged to provide movement of links thereof in any direction in a plane parallel to said predetermined plane, the opposite ends of said linear actuators being pivotally connected to one link of said linkage, said linear actuators being nonparallel, whereby selective extension and retraction of said linear actuators causes such movement of said links of said linkage, and a machine tool carried by said linkage for movement therewith for performing an operation on a workpiece so supported by said support means, and limit means which can be actuated to cause said linear actuators to cease operation, said limit means being carried by said linkage remote from said one link and arranged to move with said linkage but to experience less movement than the movement of said one link, and abutment means carried by said support means and engageable by said limit means for so actuating the same upon such movement of said linkage beyond a predetermined position in any direction for so causing said linear actuators to cease operation and preventing said linkage from moving beyond said predetermined position.

38. An arrangement for providing universal planar movement of a machine tool device comprising support means adapted to support a workpiece in a predetermined plane, a duality of linear actuators, means for pivotally connecting one end portion of each of said linear actuators to said support means for pivotal movement of said linear actuators in a plane parallel to said predetermined plane, a linkage carried by said support means and arranged to provide movement of links thereof in any direction in a plane parallel to said predetermined plane, the opposite ends of said linear actuators being pivotally connected to one link of said linkage, said linear actuators being nonparallel, whereby selective extension and retraction of said linear actuators causes such movement of said links of said linkage, and a machine tool carried by said linkage for movement therewith for performing an operation on a workpiece so supported by said support means, and said linear actuators being electrically operated, a single limit switch means carried by said linkage and connected to said linear actuators, said limit switch means having an actuating arm, and abutment means carried by said support means and engageable with said actuating arm upon such movement of said operative device beyond a predetermined position in any direction for causing said limit switch means to cause linear actuators to cease operation, thereby to prevent movement of said operative device beyond said predetermined position.

* * * * *